United States Patent
Corman

(10) Patent No.: US 8,400,235 B2
(45) Date of Patent: Mar. 19, 2013

(54) ACTIVE HYBRIDS FOR ANTENNA SYSTEMS

(75) Inventor: David W. Corman, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 338 days.

(21) Appl. No.: 12/759,043

(22) Filed: Apr. 13, 2010

(65) Prior Publication Data

US 2010/0259339 A1 Oct. 14, 2010

Related U.S. Application Data

(60) Provisional application No. 61/237,967, filed on Aug. 28, 2009, provisional application No. 61/259,375, filed on Nov. 9, 2009, provisional application No. 61/234,513, filed on Aug. 17, 2009, provisional application No. 61/222,354, filed on Jul.

(Continued)

(51) Int. Cl.
*H01P 5/12* (2006.01)
*H03F 3/68* (2006.01)

(52) U.S. Cl. .................................. 333/117; 330/124 R

(58) Field of Classification Search .................. 333/117, 333/213; 330/124 R, 103, 139, 149
See application file for complete search history.

(56) References Cited

U.S. PATENT DOCUMENTS

| | | | |
|---|---|---|---|
| 3,119,965 A | 1/1964 | Phillips | |
| 4,857,777 A | 8/1989 | Altes | |
| 4,896,374 A | 1/1990 | Waugh et al. | |
| 4,965,602 A | 10/1990 | Kahrilas et al. | |
| 4,994,773 A | 2/1991 | Chen et al. | |
| 5,045,822 A | 9/1991 | Mohwinkel | |
| 5,270,719 A | 12/1993 | Roth | |
| 5,942,929 A | 8/1999 | Aparin | |
| 5,966,049 A | 10/1999 | Yuen et al. | |
| 6,005,515 A | 12/1999 | Allen et al. | |
| 6,061,553 A | 5/2000 | Matsuoka et al. | |
| 6,232,837 B1 | 5/2001 | Yoo et al. | |
| 6,326,845 B1 | 12/2001 | Miyaji et al. | |
| 7,319,345 B2 | 1/2008 | Farjad-rad et al. | |
| 7,355,470 B2 | 4/2008 | Sorrells et al. | |
| 7,378,902 B2 | 5/2008 | Sorrells et al. | |
| 7,400,193 B2 | 7/2008 | Wyatt | |
| 7,408,507 B1 | 8/2008 | Paek et al. | |

(Continued)

FOREIGN PATENT DOCUMENTS

| | | |
|---|---|---|
| EP | 0762660 | 3/1997 |
| EP | 1193861 | 4/2002 |

(Continued)

OTHER PUBLICATIONS

International Search Report and Written Opinion dated Jul. 19, 2010, PCT US10/030881, 149 pages.

(Continued)

*Primary Examiner* — Dean O Takaoka
(74) *Attorney, Agent, or Firm* — Snell & Wilmer LLP

(57) ABSTRACT

In an exemplary embodiment, a fully monolithic active hybrid architecture can be configured to replace a ring hybrid, magic tee, branchline coupler, or 180° hybrid by providing similar functionality in an integrated monolithic solution. Exemplary embodiments of the active hybrids combine active implementations of power splitters, power combiners, and phase shifting elements in a novel fashion allowing for ultra-compact size and broadband performance. In an exemplary embodiment, the active hybrid replaces the typical hybrid couplers with active splitters and active combiners. Similarly, the delay lines and amplitude adjustment elements are replaced by active vector generators. Vector generators are magnitude and phase control circuits. The active hybrid results in certain advantages including being size independent of the operating frequency, wide frequency range of operation, and RF signals undergo a neutral or slight positive power gain, rather than power losses that occur in the passive prior art systems.

16 Claims, 10 Drawing Sheets

Related U.S. Application Data 1, 2009, provisional application No. 61/168,913, filed on Apr. 13, 2009, provisional application No. 61/259,049, filed on Nov. 6, 2009, provisional application No. 61/234,521, filed on Aug. 17, 2009, provisional application No. 61/265,605, filed on Dec. 1, 2009, provisional application No. 61/222,363, filed on Jul. 1, 2009.

(56) References Cited

U.S. PATENT DOCUMENTS

| | | | |
|---|---|---|---|
| 7,420,423 B2 * | 9/2008 | Lee et al. ..................... | 330/301 |
| 7,421,036 B2 | 9/2008 | Sorrells et al. | |
| 7,620,129 B2 | 11/2009 | Sorrells et al. | |
| 7,672,653 B2 | 3/2010 | Cowley et al. | |
| 7,728,784 B2 | 6/2010 | Mohamadi | |
| 7,746,764 B2 | 6/2010 | Rawlins et al. | |
| 7,750,733 B2 | 7/2010 | Sorrells et al. | |
| 7,755,430 B2 | 7/2010 | Imagawa | |
| 7,885,682 B2 | 2/2011 | Sorrells et al. | |
| 8,013,784 B2 | 9/2011 | Margomenos et al. | |
| 8,030,998 B2 * | 10/2011 | Corman ........................ | 330/151 |
| 8,160,530 B2 * | 4/2012 | Corman et al. ............ | 455/276.1 |
| 2002/0113648 A1 | 8/2002 | Miyaji et al. | |
| 2003/0016085 A1 | 1/2003 | Yamazaki | |
| 2003/0162566 A1 | 8/2003 | Shapira et al. | |
| 2004/0095190 A1 | 5/2004 | Klaren | |
| 2004/0121750 A1 | 6/2004 | Nation | |
| 2004/0229584 A1 | 11/2004 | Fischer et al. | |
| 2005/0113052 A1 | 5/2005 | Rabinovich | |
| 2005/0151698 A1 | 7/2005 | Mohamadi | |
| 2006/0170499 A1 | 8/2006 | Rahman et al. | |
| 2007/0248186 A1 | 10/2007 | Sorrells et al. | |
| 2007/0275674 A1 | 11/2007 | Chien | |
| 2007/0280384 A1 | 12/2007 | Hidaka | |
| 2008/0129408 A1 | 6/2008 | Nagaishi et al. | |
| 2008/0129634 A1 | 6/2008 | Pera | |
| 2008/0218424 A1 | 9/2008 | Blanton | |
| 2009/0091384 A1 | 4/2009 | Sorrells et al. | |
| 2010/0039174 A1 * | 2/2010 | Teetzel ........................ | 330/149 |
| 2010/0073085 A1 | 3/2010 | Sorrells et al. | |
| 2010/0097138 A1 | 4/2010 | Sorrells et al. | |
| 2010/0225389 A1 | 9/2010 | Teetzel | |
| 2010/0259312 A1 * | 10/2010 | Menon et al. ................. | 327/416 |
| 2010/0260285 A1 * | 10/2010 | Corman et al. .............. | 375/295 |
| 2010/0321107 A1 | 12/2010 | Honcharenko | |

FOREIGN PATENT DOCUMENTS

| | | |
|---|---|---|
| JP | 2003168938 | 6/2003 |
| WO | WO9945609 | 8/1999 |
| WO | WO0003456 | 1/2000 |
| WO | WO0241442 | 5/2002 |
| WO | WO03036756 | 5/2003 |

OTHER PUBLICATIONS

International Search Report and Written Opinion dated Aug. 23, 2010, PCT/US2010/30864,12 pages.
Kwang-Jin, Koh, Gabriel M. Rebeiz, 0.13-mu m CMOS phase shifters for X-, Ku, and K-band phased arrays, IEEE Journal of Solid State Circuits, 2007, 14 pages.
Kwang-Jin, Koh, Jason W. May, Gabriel M. Rebeiz A Q-Band (40-45 GHz) 16-Element Phased-Array Transmitter in 0.18-μm SiGe BiCMOS Technology, IEEE Radio Frequency Integrated Circuits Symposium, 2008, 4 pages.
Kwang-Jin, Koh, Gabriel M. Rebeiz, an X- and Ku-Band 8-Element Phased-Array Receiver in 0.18-μm SiGe BiCMOS Technology, IEEE Journal of Solid State Circuits, Jun. 2008, 12 pages.
International Preliminary Report on Patentability dated Jul. 21, 2011 from PCT/US2010/030877.
International Preliminary Report on Patentability dated Jul. 21, 2011 from PCT/US10/30906.
International Preliminary Report on Patentability dated Jul. 21, 2011 from PCT/US10/30892.

Office Action dated Sep. 29, 2011 from U.S. Appl. No. 12/759,059.
Office Action dated Jan. 4, 2012 from U.S. Appl. No. 12/759,148.
Notice of Allowance dated Jul. 27, 2011 in U.S. Appl. No. 12/759,064.
USPTO; Office Action dated Apr. 7, 2011 in U.S. Appl. No. 12/759,064.
Zheng et al., "Full 360 degree Vector-Sum Phase-Shifter for Microwave System Applications," IEEE Transactions on Circuits and Systems I: Regular Papers, Downloaded on Jul. 8, 2009, pp. 1-7.
Ayari et al., "Automatic Test Vector Generation for Mixed-Signal Circuits," 1995, Ecole Polytechnique of the University of Montreal, 6 pages.
Strassberg, Dan, "RF-vector-signal generator combines high throughput, low phase noise," EDN, Oct. 6, 2009, 2 pages, UBM Electronics.
International Search Report and Written Opinion dated Oct. 27, 2010, PCT/US10/030876, 8 pages.
International Search Report and Written Opinion dated Nov. 18, 2010, PCT/US10/30871, 10 pages.
International Search Report and Written Opinion dated Nov. 26, 2010, PCT/US10/30868, 10 pages.
International Search Report and Written Opinion dated Nov. 26, 2010, PCT/US10/30877, 10 pages.
Tokumitsu et al.—Active isolator, combiner, divider and magic-T as miniaturized function blocks dated Nov. 6, 1998.
International Search Report and Written Opinion dated Nov. 26, 2010, PCT/US10/30866, 8 pages.
Viallon et al. An Original SiGe Active Differential Output Power Splitter for Millimetre-wave Applications, 2003.
International Search Report and Written Opinion dated Nov. 26, 2010, PCT/US10/30892, 9 pages.
International Search Report and Written Opinion dated Nov. 26, 2010, PCT/US10/30872, 9 pages.
Hsiao Analysis of Interleaved Arrays of Nov. 1971.
International Search Report and Written Opinion dated Nov. 30, 2010, PCT/US10/30906, 11 pages.
International Preliminary Report dated Oct. 27, 2011 from PCT/US10/030864.
International Preliminary Report dated Oct. 27, 2011 from PCT/US10/30868.
International Preliminary Report dated Oct. 27, 2011 from PCT/US10/030881.
International Preliminary Report dated Oct. 27, 2011 from PCT/US10/30872.
International Preliminary Report dated Oct. 27, 2011 from PCT/US10/30871.
International Preliminary Report dated Oct. 27, 2011 from PCT/US10/30866.
International Preliminary Report dated Oct. 27, 2011 from PCT/US10/030876.
Office Action dated Feb. 27, 2012 in U.S. Appl. No. 12/759,130.
Notice of Allowance dated Feb. 28, 2012 in U.S. Appl. No. 12/759,059.
Office Action dated May 7, 2012 in U.S. Appl. No. 12/759,113.
Office Action dated Aug. 2, 2012 in U.S. Appl. No. 12/758,996.
Notice of Allowance dated Aug. 14, 2012 in U.S. Appl. No. 12/759,123.
Notice of Allowance dated Aug. 20, 2012 in U.S. Appl. No. 12/759,148.
Office Action dated Aug. 21, 2012 in U.S. Appl. No. 12/759,113.
Aminghasem Safarian et al., "Distributed Active Power Combiners and Splitters for Multi-Antenna UWB Transceivers" Sep. 2006, pp. 138-141.
Notice of Allowance dated May 10, 2012 in U.S. Appl. No. 12/759,130.
Office Action dated May 17, 2012 in U.S. Appl. No. 12/759,043.
Supplemental Notice of Allowability dated May 29, 2012 in U.S. Appl. No. 12/759,130.
Office Action dated May 29, 2012 in U.S. Appl. No. 12/759,123.
Final Office Action dated Jun. 5, 2012 in U.S. Appl. No. 12/759,148.
Supplemental Notice of Allowability dated Jun. 11, 2012 in U.S. Appl. No. 12/759,130.

* cited by examiner $$[S] = \begin{bmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{bmatrix} = -j/\sqrt{2} \begin{bmatrix} 0 & 1 & 1 & 0 \\ 1 & 0 & 0 & 1 \\ 1 & 0 & 0 & -1 \\ 0 & 1 & -1 & 0 \end{bmatrix}$$

$$[S] = \begin{bmatrix} S11 & S12 & S13 & S14 \\ S21 & S22 & S23 & S24 \\ S31 & S32 & S33 & S34 \\ S41 & S42 & S43 & S44 \end{bmatrix} = -j/\sqrt{2} \begin{bmatrix} 0 & 1 & 1 & 0 \\ 1 & 0 & 0 & 1 \\ 1 & 0 & 0 & -1 \\ 0 & 1 & -1 & 0 \end{bmatrix}$$

Figure 4B (Prior Art)

Port 3

Port 4

Port 1

Port 2

$$[S] = \begin{bmatrix} S11 & S12 & S13 & S14 \\ S21 & S22 & S23 & S24 \\ S31 & S32 & S33 & S34 \\ S41 & S42 & S43 & S44 \end{bmatrix} = -j/\sqrt{2} \begin{bmatrix} 0 & 0 & +1 & -j \\ 0 & 0 & -j & +1 \\ +1 & -j & 0 & 0 \\ -j & +1 & 0 & 0 \end{bmatrix}$$

Figure 6A (Prior Art)

ACTIVE HYBRIDS FOR ANTENNA SYSTEMS

CROSS REFERENCE TO RELATED APPLICATIONS

This application is a non-provisional of U.S. Provisional Application No. 61/237,967, entitled "ACTIVE BUTLER AND BLASS MATRICES," which was filed on Aug. 28, 2009. This application is also a non-provisional of U.S. Provisional Application No. 61/259,375, entitled "ACTIVE HYBRIDS FOR ANTENNA SYSTEMS," which was filed on Nov. 9, 2009. This application is a non-provisional of U.S. Provisional Application No. 61/234,513, entitled "ACTIVE FEED FORWARD AMPLIFIER," which was filed on Aug. 17, 2009. This application is a non-provisional of U.S. Provisional Application No. 61/222,354, entitled "ACTIVE PHASED ARRAY ARCHITECTURE," which was filed on Jul. 1, 2009. This application is a non-provisional of U.S. Provisional Application No. 61/168,913, entitled "ACTIVE COMPONENT PHASED ARRAY ANTENNA," which was filed on Apr. 13, 2009. This application is also a non-provisional of U.S. Provisional Application No. 61/259,049, entitled "DYNAMIC REAL-TIME POLARIZATION FOR ANTENNAS," which was filed on Nov. 6, 2009. This application is a non-provisional of U.S. Provisional Application No. 61/234,521, entitled "MULTI-BAND MULTI-BEAM PHASED ARRAY ARCHITECTURE," which was filed on Aug. 17, 2009. This application is a non-provisional of U.S. Provisional Application No. 61/265,605, entitled "HALF-DUPLEX PHASED ARRAY ANTENNA SYSTEM," which was filed on Dec. 1, 2009. This application is a non-provisional of U.S. Provisional Application No. 61/222,363, entitled "BIDIRECTIONAL ANTENNA POLARIZER," which was filed on Jul. 1, 2009. All of the contents of the previously identified applications are hereby incorporated by reference for any purpose in their entirety.

BACKGROUND OF THE INVENTION

Practically all radio frequency (RF) and antenna systems utilize a range of components such as phase shifters, power splitters, power combiners, RF hybrids, and baluns. In RF applications, these components are typically implemented as distributed functions either on gallium arsenide (GaAs) or other suitable RF substrate material. Though other materials may be used, GaAs is a higher quality material designed and controlled to provide good performance of electronic devices. However, in addition to being a higher quality material than other possible materials, GaAs is also more expensive and more difficult to manufacture. For phased array applications, these functions are typically implemented at every element in the phased array which greatly increases system size, weight, cost, and complexity.

Quadrature hybrids or other differential phase generating hybrids are used in a variety of RF applications. In an exemplary embodiment, quadrature hybrids are used for generating circular polarization signals, power combining, or power splitting. In an exemplary embodiment, the outputs of a quadrature hybrid have approximately equal amplitude and a 90° phase difference. In another typical embodiment, the quadrature hybrid is implemented as a distributed structure, such as a Lange coupler, or a branchline hybrid coupler. Other 180° hybrids, such as a magic tee or a ring hybrid, result in 180° phase shift. In general, quadrature hybrids and 180° hybrids are limited in frequency band and require significant physical space. Moreover, the quadrature hybrids and 180° hybrids are typically made of GaAs and have associated RF power loss on the order of 3-4 dB per hybrid when used as a power splitter, and an associated power loss of about 1 dB when used as a power combiner.

In particular, branchline hybrids are used for a variety of functions where generation or summation of quadrature signals is required. Applications include generation of polarization signals, power combining, power splitting, balanced amplifiers, and the like. Due to its distributed nature, the branchline hybrid is only capable of operating over a relatively narrow band of frequencies (typically 10% bandwidth) and requires significant physical space to be produced, particularly at lower frequencies where wavelengths are longer, such as C-band or below. Furthermore, a branchline hybrid typically results in significant RF ohmic losses.

In addition, ring hybrids are used for various applications, including generation of polarization signals, power combining, power splitting, and the like. Like the branchline coupler, due to its distributed nature, the ring hybrid is only capable of operating over a relatively narrow band of frequencies (typically 10% bandwidth) and requires significant physical space to be produced, particularly at lower frequencies where wavelengths are longer, such as C-band or below. Also, a ring hybrid typically results in significant RF ohmic losses.

Similarly, magic tee hybrids are used for various functions involving generation or summation of in-phase signals or 180° out-of-phase signals. Applications include generation of polarization signals, power combining, power splitting, and the like. One such typical application is using the magic tee hybrid in a waveguide. Due to its distributed waveguide nature, the magic tee hybrid is only capable of operating over a relatively narrow band of frequencies (typically 40% bandwidth) and requires significant physical space to be realized, making it impractical to use at lower frequencies.

Thus, a need exists for a fully integrated monolithic solution of a hybrid to replace a branchline hybrid, a 180° hybrid, a ring hybrid, or a magic tee while providing the same or similar functionality. Furthermore, a need exists for a hybrid that is compact and cost effective. Also, a need exists for a hybrid that has a wide operational bandwidth and does not suffer from high RF losses.

SUMMARY

In an exemplary embodiment, a fully monolithic silicon germanium (SiGe) based architecture can be configured to replace a ring hybrid, magic tee, branchline coupler, or 180° hybrid by providing similar functionality in an integrated monolithic solution. Exemplary embodiments of the active hybrids combine active implementations of power splitters, power combiners, and phase shifting elements in a novel fashion allowing for ultra-compact size and broadband performance. In an exemplary embodiment, the active hybrid replaces the typical hybrid couplers with active splitters and active combiners. Similarly, the delay lines and amplitude adjustment elements are replaced by active vector generators. Vector generators are magnitude and phase control circuits.

A monolithic SiGe embodiment using active components results in certain advantages over the distributed network in the prior art, including lower cost and smaller physical size. Some other advantages include that the size of the active hybrid is independent of the operating frequency and that RF signals undergo a neutral or slight positive power gain, rather than power losses that occur in the passive prior art systems. Another advantage is that the hybrid has wider operating bandwidths and can be configured for broadband enabled operation over multiple frequency bands. In other words, in an exemplary embodiment the hybrid is applicable to all frequency bands, including X, K, Ku, Ka, and Q bands. In an exemplary embodiment, the hybrid operates over specific frequency ranges, such as 2-20 GHz, 20-40 GHz, or 30-45 GHz.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

FIG. 4B illustrates a prior art example of a magic tee hybrid;

FIG. 6A illustrates a prior art example of a branchline hybrid; and

DETAILED DESCRIPTION OF THE INVENTION

While exemplary embodiments are described herein in sufficient detail to enable those skilled in the art to practice the invention, it should be understood that other embodiments may be realized and that logical material, electrical, and mechanical changes may be made without departing from the spirit and scope of the invention. Thus, the following detailed description is presented for purposes of illustration only.

In an exemplary embodiment, an active hybrid has various designs and is comprised of various components. The active hybrid may perform the functions of different passive hybrids, such as a branchline hybrid, a magic tee hybrid, or a passive quadrature hybrid. Regardless, the various components of the active hybrid may include a vector generator, an active power splitter, an active power combiner, or the like. Furthermore, the embodiments described in this application may include passive components in place of the active components so long as at least one active component is present.

Figure 1:
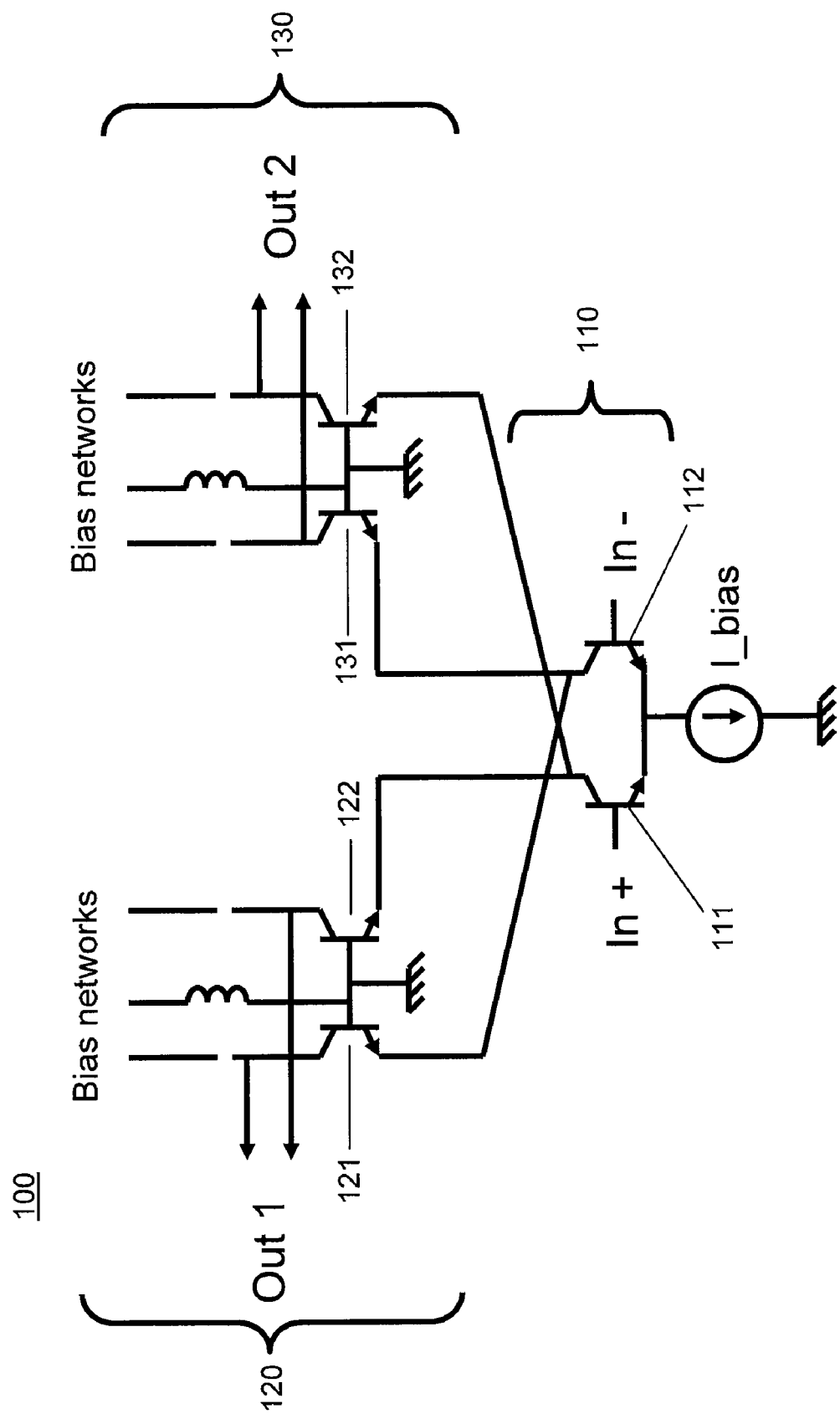
FIG. 1 illustrates an exemplary embodiment of an active power splitter.

Active Splitter: FIG. 1 illustrates a schematic of an exemplary active power splitter. In an exemplary embodiment, an active power splitter 100 comprises a differential input subcircuit 110, a first differential output subcircuit 120, and a second differential output subcircuit 130. The differential input subcircuit 110 has paired transistors 111, 112 with a common emitter node and is constant current biased, as is typical in a differential amplifier. An input signal is communicated to the base of paired transistors 111, 112 in the differential input subcircuit 110. Both the first and second differential output subcircuits 120, 130 comprise a pair of transistors with a common base node and each common base is connected to ground.

The first differential output subcircuit 120 has a first transistor 121 emitter connected to the collector of one of the input subcircuit transistors 112. The emitter of the second output subcircuit transistor 122 is connected to the collector of the other input subcircuit transistor 111. In the exemplary embodiment, the first output is drawn from the collectors of transistors 121, 122 of the first differential output subcircuit 120. Furthermore, the second differential output subcircuit 130 is similarly connected, except the transistor 131, 132 emitters are inversely connected to the input subcircuit transistor 111, 112 collectors with respect to transistors 121, 122.

By inverting the input subcircuit transistor collector connections between the first and second differential output subcircuits, the first output and the second output are approximately 180° out of phase with each other. In another exemplary embodiment, transistor 131, 132 emitters are non-inversely connected to input subcircuit transistor 111, 112 collectors, causing the first output and the second output to be approximately in phase with each other. In general, the absolute phase shift of the output signals through the power splitter is not as important as the relative phasing between the first and second output signals.

In an exemplary embodiment, active power splitter 100 converts an input RF signal into two output signals. The output signal levels may be equal in amplitude, though this is not required. For a prior art passive power splitter, each output signal would be about 3 dB lower in power than the input signal. In contrast, an exemplary active splitter, such as active power splitter 100, can provide gain and the relative power level between the input signal and the output signal is adjustable and can be selectively designed. In an exemplary embodiment, the output signal is configured to achieve a substantially neutral or positive power gain over the input signal. For example, the output signal may achieve a 3 dB signal power gain over the input signal. In an exemplary embodiment, the output signal may achieve a power gain in the 0 dB to 5 dB range. Moreover, the output signal may be configured to achieve any suitable power gain. In accordance with an exemplary embodiment, active power splitter 100 produces output signals with a differential phase between the two signals that is zero or substantially zero. The absolute phase shift of output signals through the active power splitter may not be as important as the differential phasing between the output signals.

In another exemplary embodiment, active power splitter 100 additionally provides matched impedances at the input and output ports. The matched impedances may be 50 ohms, 75 ohms, or other suitable impedances. Furthermore, in an exemplary embodiment, active splitter 100 provides isolation between the output ports of the active power splitter. In one exemplary embodiment, active power splitter 100 is manufactured as a radio frequency integrated circuit (RFIC) with a compact size that is independent of the operating frequency due to a lack of distributed components.

Figure 2:
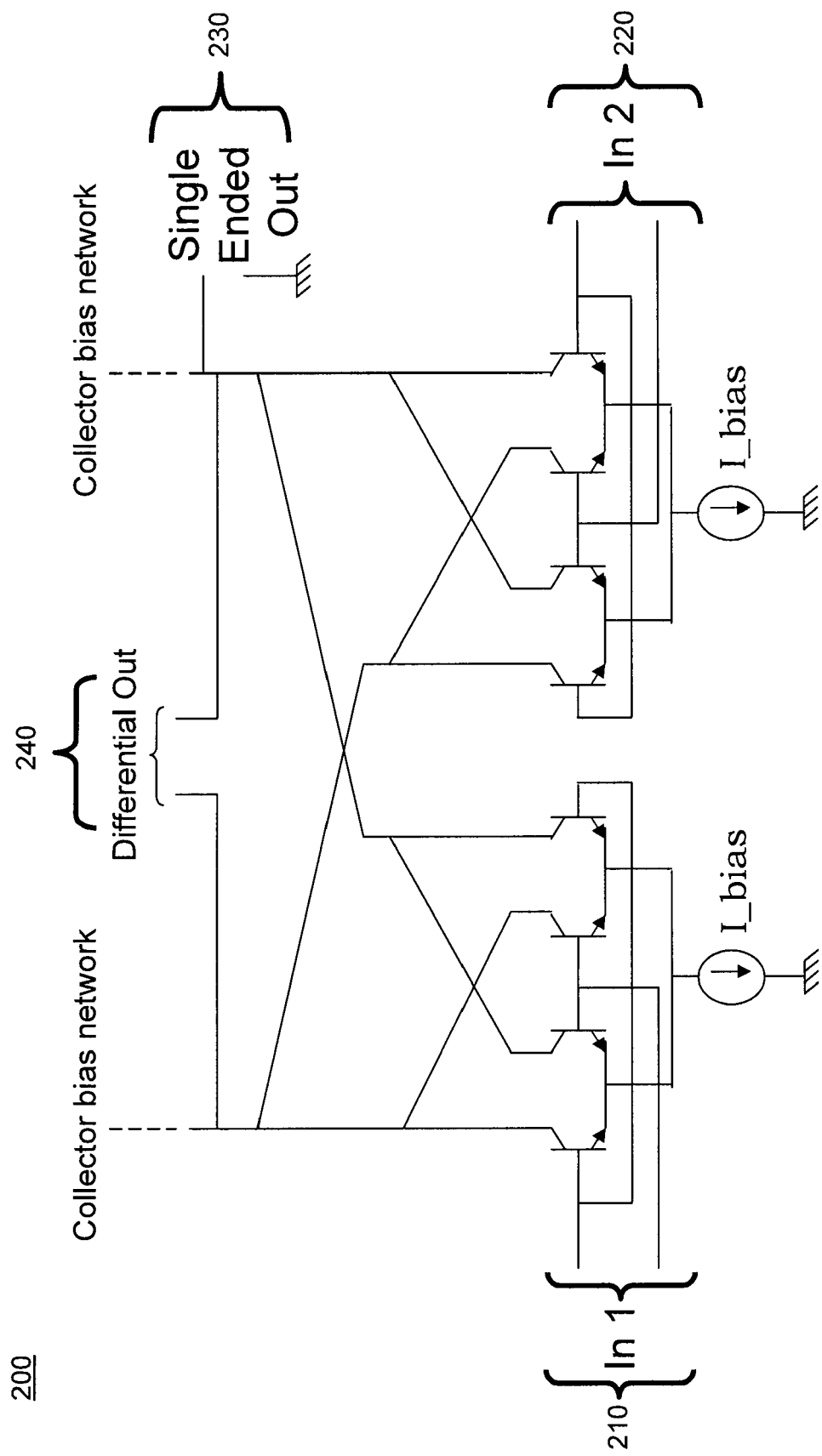
FIG. 2 illustrates an exemplary embodiment of an active power combiner.

Active Combiner: In an exemplary embodiment and with reference to FIG. 2, an active power combiner 200 comprises a first differential input subcircuit 210, a second differential input subcircuit 220, a single ended output subcircuit 230, and a differential output subcircuit 240. Each differential input subcircuit 210, 220 includes two pairs of transistors, with each transistor of each differential input subcircuit 210, 220 having a common emitter node with constant current biasing, as is typical in a differential amplifier.

A first input signal is communicated to the bases of the transistors in first differential input subcircuit 210. For example, a first line of input signal In1 is provided to one transistor of each transistor pair in first differential input subcircuit 210, and a second line of input signal In1 is provided to the other transistor of each transistor pair. Similarly, a second input signal is communicated to the bases of the transistors in second differential input subcircuit 220. For example, a first line of input signal In2 is provided to one transistor of each transistor pair in first differential input subcircuit 220, and a second line of input signal In2 is provided to the other transistor of each transistor pair. Furthermore, in an exemplary embodiment, a differential output signal is formed by a combination of signals from collectors of transistors in first and second differential input subcircuits 210, 220.

In an exemplary embodiment, active power combiner 200 converts two input RF signals into a single output signal. The output signal can either be a single ended output at single ended output subcircuit 230, or a differential output at differential output subcircuit 240. In other words, active power combiner 200 performs a function that is the inverse of active power splitter 100. The input signal levels can be of arbitrary amplitude and phase. Similar to an active power splitter, active power combiner 200 can provide gain and the relative power level between the inputs and output is also adjustable and can be selectively designed. In an exemplary embodiment, the output signal achieves a substantially neutral or positive signal power gain over the input signal. For example, the output signal may achieve a 3 dB power gain over the sum of the input signals. In an exemplary embodiment, the output signal may achieve a power gain in the 0 dB to 5 dB range. Moreover, the output signal may achieve any suitable power gain.

In an exemplary embodiment, active power combiner 200 additionally provides matched impedances at the input and output ports. The matched impedances may be 50 ohms, 75 ohms, or other suitable impedances. Furthermore, in an exemplary embodiment, active power combiner 200 provides isolation between the input ports of the power combiner. In one exemplary embodiment, active power combiner 200 is manufactured as a RFIC with a compact size that is independent of the operating frequency due to a lack of distributed components.

Vector Generator: In an exemplary embodiment, a vector generator converts an RF input signal into an output signal (sometimes referred to as an output vector) that is shifted in phase and/or amplitude to a desired level. This replaces the function of a typical phase shifter and adds the capability of amplitude control. In other words, a vector generator is a magnitude and phase control circuit. In the exemplary embodiment, the vector generator accomplishes this function by feeding the RF input signal into a quadrature network resulting in two output signals that differ in phase by about 90°. The two output signals are fed into parallel quadrant select circuits, and then through parallel variable gain amplifiers (VGAs). In an exemplary embodiment, the quadrant select circuits receive commands and may be configured to either pass the output signals with no additional relative phase shift between them or invert either or both of the output signals by an additional 180°. In this fashion, all four possible quadrants of the 360° continuum are available to both orthogonal signals. The resulting composite output signals from the current summer are modulated in at least one of amplitude and phase.

Figure 3:
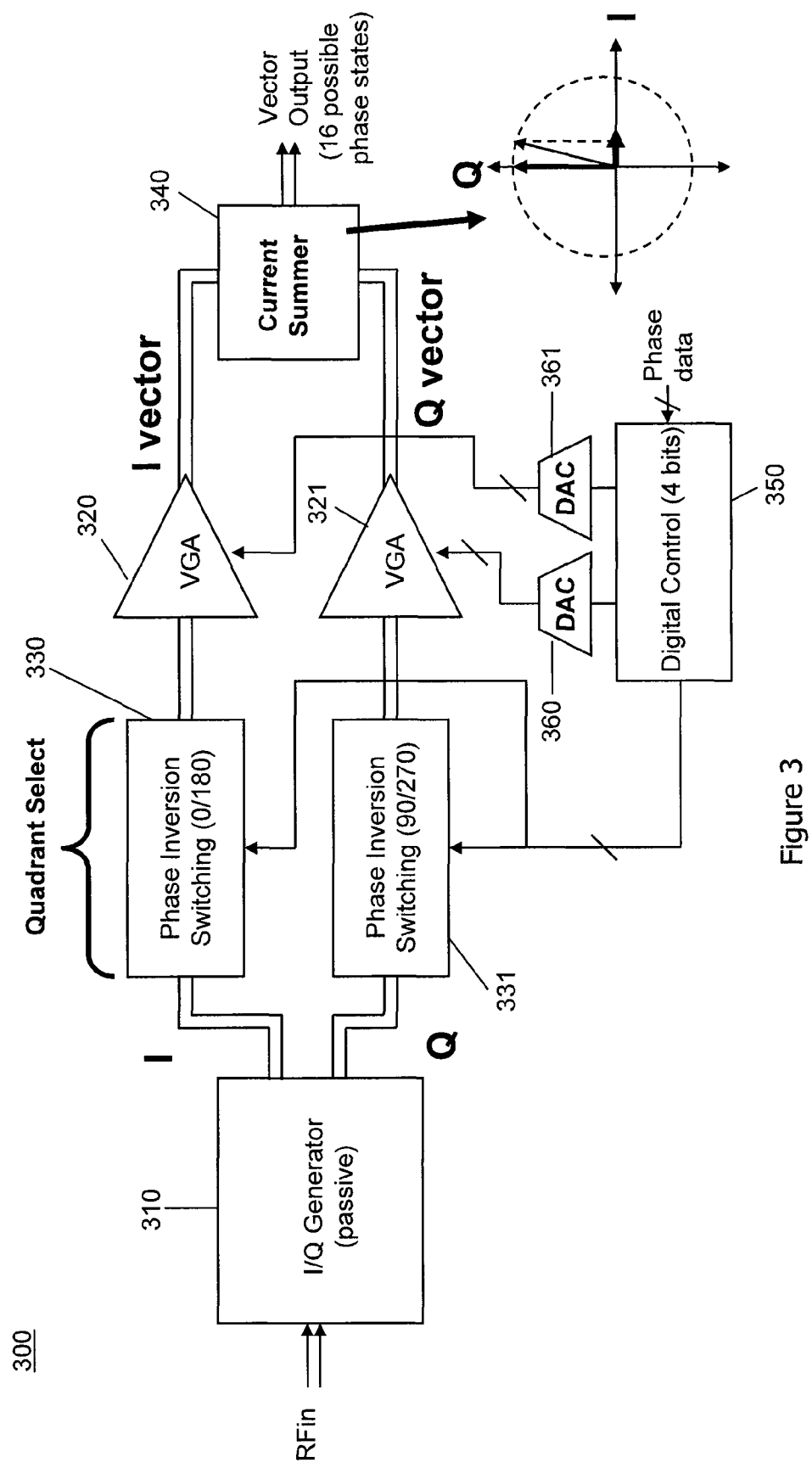
FIG. 3 illustrates an exemplary embodiment of an active vector generator.

In accordance with an exemplary embodiment and with reference to FIG. 3, a vector generator 300 comprises a passive I/Q generator 310, a first VGA 320 and a second VGA 321, a first quadrant select 330 and a second quadrant select 331 each configured for phase inversion switching, and a current summer 340. The first quadrant select 330 is in communication with I/Q generator 310 and first VGA 320. The second quadrant select 331 is in communication with I/Q generator 310 and second VGA 321. Furthermore, in an exemplary embodiment, vector generator 300 comprises a digital controller 350 that controls a first digital-to-analog converter (DAC) 360 and a second DAC 361. The first and second DACs 360, 361 control first and second VGAs 321, 320, respectively. Additionally, digital controller 350 controls first and second quadrant selects 330, 331.

In an exemplary embodiment, vector generator 300 controls the phase and amplitude of an RF signal by splitting the RF signal into two separate vectors, the in-phase (I) vector and the quadrature-phase (Q) vector. In one embodiment, the RF signal is communicated differentially. The differential RF signal communication may be throughout vector generator 300 or limited to various portions of vector generator 300. In another exemplary embodiment, the RF signals are communicated non-differentially. The I vector and Q vector are processed in parallel, each passing through the phase inverting switching performed by first and second quadrant selects 330, 331. The resultant outputs of the phase inverting switches comprise four possible signals: a non-inverted I, an inverted I, a non-inverted Q, and an inverted Q. In this manner, all four quadrants of a phasor diagram are available for further processing by VGAs 320, 321. In an exemplary embodiment, two of the four possible signals non-inverted I, inverted I, non-inverted Q, and inverted Q are processed respectively through VGAs 320, 321, until the two selected signals are combined in current summer 340 to form a composite RF signal. The current summer 340 outputs the composite RF signal with phase and amplitude adjustments. In an exemplary embodiment, the composite RF signal is in differential signal form. In another exemplary embodiment, the composite RF signals are in single-ended form.

In an exemplary embodiment, control for the quadrant shifting and VGA functions is provided by a pair of DACs. In an exemplary embodiment, reconfiguration of digital controller 350 allows the number of phase bits to be digitally controlled after vector generator 300 is fabricated if adequate DAC resolution and automatic gain control (AGC) dynamic range exists. In an exemplary embodiment with adequate DAC resolution and AGC dynamic range, any desired vector phase and amplitude can be produced with selectable fine quantization steps using digital control. In another exemplary embodiment, reconfiguration of DACs 360, 361 can be made after vector generator 300 is fabricated in order to facilitate adjustment of the vector amplitudes.

Active Hybrids

In an exemplary embodiment, an active hybrid replaces a traditional hybrid by providing similar functionality in an integrated monolithic solution. Some of the traditional distributed hybrids that can be replaced include ring hybrids, branchline hybrids, or magic tee hybrids.

In accordance with an exemplary embodiment, an active hybrid comprises active components manufactured on silicon germanium (SiGe) in a monolithic solution. Other materials may be used, such as GaAs, silicon, or other suitable materials now known or hereinafter devised. A monolithic SiGe embodiment using active components results in certain advantages over the distributed network in the prior art, including lower cost and smaller physical size. Some other advantages include that RF signals undergo a neutral or slight positive power gain, rather than power losses that occur in the passive prior art systems. The power gain may be, for example, in the range of 0-5 dB.

Another advantage is that the active hybrid has wider operating bandwidths and can be configured for broadband enabled operation over multiple frequency bands. In other words, in an exemplary embodiment the hybrid is applicable to all frequency bands, including X, K Ku, Ka, and Q bands.

In an exemplary embodiment, the active hybrid operates over specific frequency ranges, such as 2-20 GHz, 20-40 GHz, 30-45 GHz, or other suitable ranges.

In accordance with an exemplary embodiment, the wide operating bandwidth and frequency range is due in part to the integrated nature of the active hybrid. The size of the active hybrid is independent of the operating frequency. In the prior art, typical hybrids are distributed structures where the size of the hybrid depends on operating frequency and has a limited operating frequency range.

Additionally, other advantages over the prior art embodiments are possible, depending on the hybrid architecture. Some of the advantages include extensive system flexibility and very compact systems because no distributed structures are required. Furthermore, some embodiments employ differential signaling to improve signal isolation and interference rejection when the RF signal is in analog form.

Differential Phase Generating Hybrid

Figure 4A:
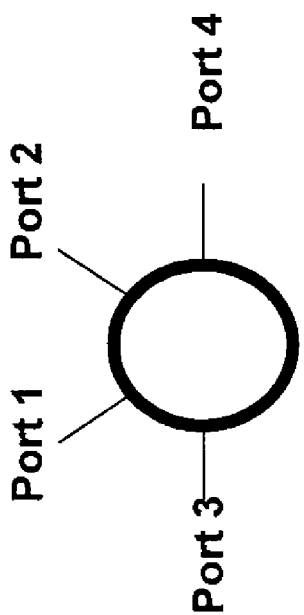
FIG. 4A illustrates a prior art example of a ring hybrid.

FIG. 4A illustrates a prior art ring hybrid having four ports and configured for bi-directional communications. FIG. 4B illustrates a prior art magic tee hybrid having four ports and configured for bi-directional communications. In these prior art examples, each of the ports provides a phase shifted replica of the associated input signal that is attenuated in amplitude due to the power split plus ohmic RF losses.

In accordance with an exemplary embodiment, an active differential phase generating (DPG) hybrid also has four ports but is not amplitude limited and communicates in a single direction in contrast to a ring hybrid and a magic tee hybrid. In one embodiment, the active DPG hybrid does not have ohmic RF losses or power split losses.

Figure 4C:
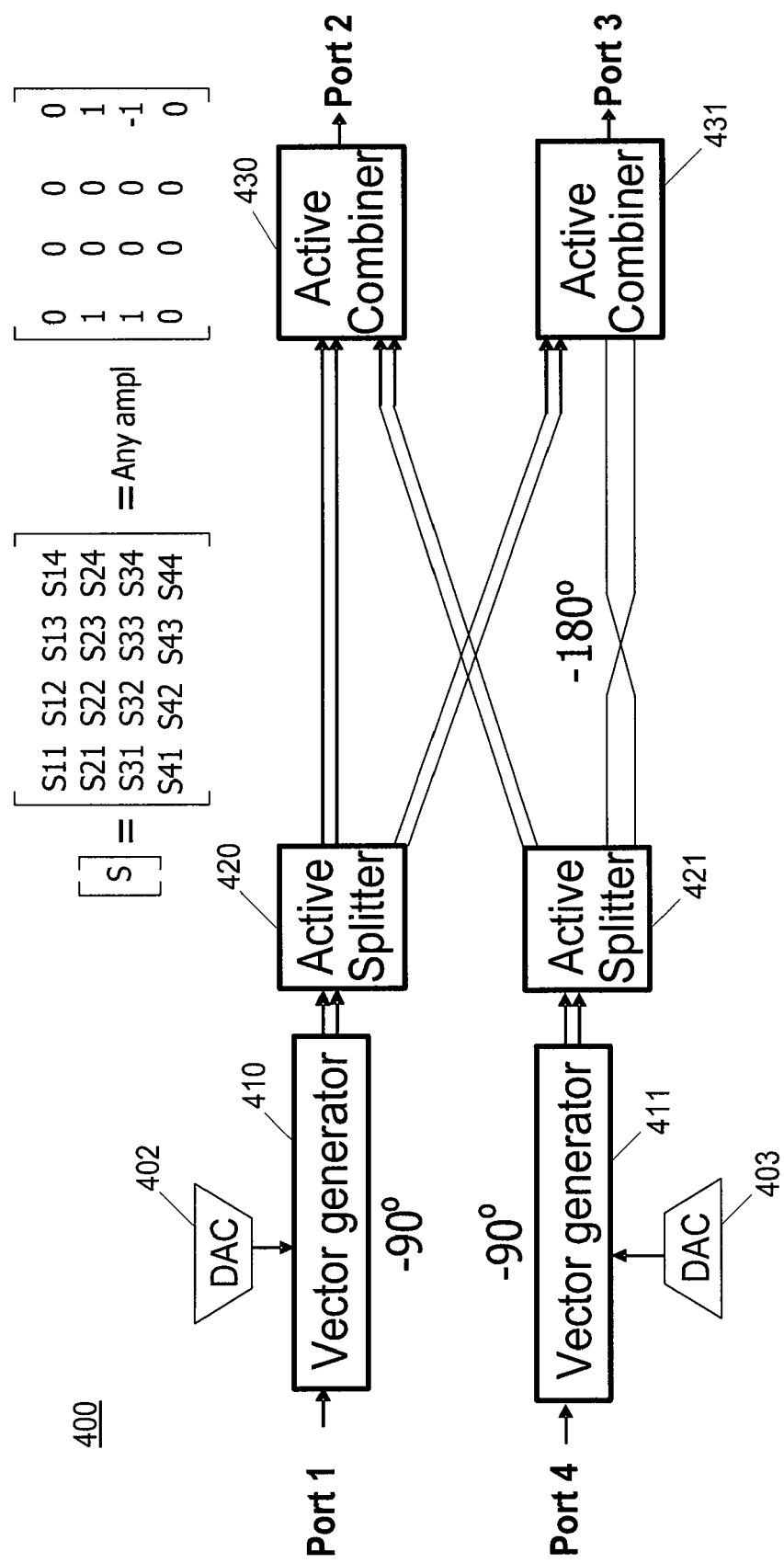
FIG. 4C illustrates an exemplary embodiment of an active differential phase generating hybrid.

With momentary reference to FIG. 4C, and in accordance with an exemplary embodiment, an active DPG hybrid 400 provides similar functionality in comparison to a traditional distributed ring hybrid and magic tee. For example, for an input signal at Port 4, active DPG hybrid 400 is dynamically configured to have a 180° phase difference between output Port 2 and output Port 3. In addition, for an input signal at Port 1, active DPG hybrid 400 is dynamically configured to have a 0° phase difference between output Port 2 and output Port 3. In accordance with another exemplary embodiment, active DPG hybrid 400 provides port-to-port isolation and matched impedances at the input/output ports.

Furthermore, active DPG hybrid 400 has various advantages over a traditional passive distributed hybrid. In an exemplary embodiment, active DPG hybrid 400 does not result in a loss of power but instead has a gain or is at least gain neutral. The power gain may be, for example, in the range of 0-5 dB. In another exemplary embodiment, active DPG hybrid 400 does not rely on distributed elements and is capable of operating over very wide bandwidths. In one exemplary embodiment, active DPG hybrid 400 is manufactured as an RFIC and is compact.

In accordance with an exemplary embodiment and with continuing reference to FIG. 4C, an active DPG hybrid 400 comprises a first vector generator 410, a first active splitter 420, a first active combiner 430, a second vector generator 411, a second active splitter 421, and a second active combiner 431. Active splitters 420, 421 may be of similar description as active splitter 100. Active combiners 430, 431 may be of similar description as active combiner 200. In addition, vector generators 410, 411 may be of similar description as vector generator 300. Furthermore, active DPG hybrid 400 comprises DACs 402, 403 to control first vector generator 410 and second vector generator 411, respectively. In an exemplary embodiment, a 4-bit DAC is used but any number of bits many be used. In accordance with the exemplary embodiment, first vector generator 410 receives a first input at Port 1 and communicates the first input to first active splitter 420. Likewise, second vector generator 411 receives a second input at Port 4 and communicates the second input to second active splitter 421. In an exemplary embodiment, vector generators 410, 411 parallel process the first and second input vectors that are modulated in amplitude and phase. In one specific embodiment, vector generators 410, 411 provide a −90° phase shift.

In another exemplary embodiment, active DPG hybrid 400 comprises active splitters 420, 421 and active combiners 430, 431. Active DPG hybrid 400 is still configured to provide either a 0° or 180° phase difference between output Port 2 and output Port 3. However, without vector generators 410, 411, a 90° phase shift between the input signal and the output signals is present.

Furthermore, the output of first active splitter 420 is communicated to first active power combiner 430 and second active power combiner 431. Similarly, the output of second active splitter 421 is communicated to first active combiner 430 and second active power combiner 431. In an exemplary embodiment, the signal transmitted from active splitter 421 to active combiner 431 is inverted to produce a 180° phase difference. In one embodiment, the appropriate interior differential lines are swapped to produce the 180° phase shift. In an exemplary embodiment, and as illustrated in FIG. 4C, active DPG hybrid 400 communicates the signal vectors in differential form between vector generators 410, 411 and active combiners 430, 431. Active splitters 420, 421 and active combiners 430, 431 may implement differential amplifiers to provide the desired functions. Moreover, in an exemplary embodiment, differential signals on a SiGe circuit provide field confinement and improve isolation. In another exemplary embodiment, non-differential signaling is used in all or portions of active DPG hybrid 400. For example, non-differential signaling may be used between vector generators 410, 411 and active splitters 420, 421, respectively. In another example, it is used between active splitters 420, 421 and active combiners 430, 431. In yet another example, non-differential signaling may be present at the input Ports 1 and 4, and/or at output Ports 2 and 3.

In the exemplary embodiment, first active power combiner 430 receives input vectors from first active splitter 420 and second active splitter 421, and outputs a signal to Port 2. The two vectors are summed in the output stage, resulting in a composite vector. Similarly, second active power combiner 431 receives input vectors from the second active splitter 420 and first active splitter 421, and outputs a signal to Port 3. As with first active combiner 430, the two vectors are summed in the output stage, resulting in a composite vector.

Active 180° Hybrid

Figure 5A:
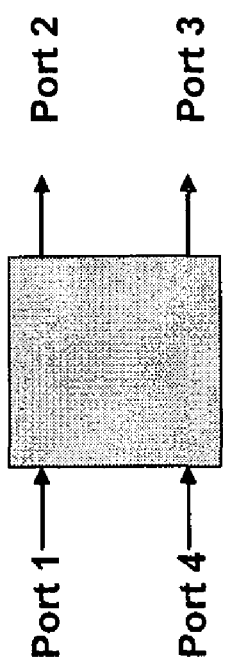
FIG. 5A illustrates a prior art example of a 180° hybrid.

In accordance with another exemplary embodiment, another type of hybrid is disclosed: the active 180° hybrid. FIG. 5A illustrates a theoretical 180° hybrid having four ports and configured for bi-directional communications. In this example, each of the output ports provides a phase shifted replica of the associated input signal that is attenuated in amplitude due to the power split plus ohmic RF losses. In accordance with an exemplary embodiment, an active 180° hybrid also has four ports but in contrast is not amplitude limited and communicates in a single direction.

Figure 5B:
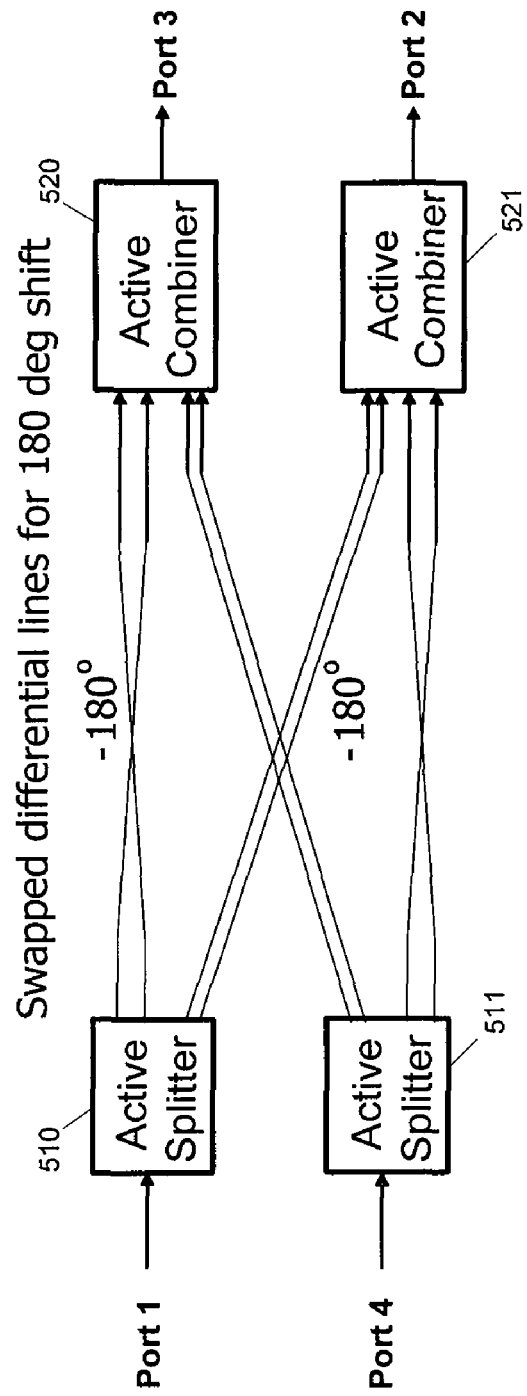
FIG. 5B illustrates an exemplary embodiment of an active 180° hybrid.

Furthermore, in various exemplary embodiments and with momentary reference to FIG. 5B, an active 180° hybrid 500 has various advantages over a traditional passive distributed 180° hybrid. In an exemplary embodiment, active 180° hybrid 500 does not result in a loss of power but instead has a gain or is at least gain neutral. In one embodiment, the active 180° hybrid does not have ohmic RF losses or power split losses. In another exemplary embodiment, active 180° hybrid 500 does not rely on distributed elements and is capable of operating over very wide bandwidths. In one exemplary embodiment, active 180° hybrid 500 is manufactured as an RFIC and is compact.

In accordance with an exemplary embodiment, active 180° hybrid 500 provides similar functionality in comparison to a theoretical distributed 180° hybrid (see FIG. 5A). For example, for an input signal appearing at either input Port 1 or input Port 4, active 180° hybrid 500 is dynamically configured to provide a 180° phase difference between the resultant signals at output Port 2 and output Port 3. In another exemplary embodiment, active 180° hybrid 500 provides port-to-port isolation and matched impedances at the input/output ports.

In accordance with an exemplary embodiment and with reference to FIG. 5B, an active 180° hybrid 500 comprises a first active splitter 510, a second active splitter 511, a first active combiner 520, and a second active combiner 521. Active splitters 510, 511 may be of similar description as active splitter 100. Active combiners 520, 521 may be of similar description as active combiner 200. In accordance with the exemplary embodiment, first active splitter 510 receives a first input at Port 1 and communicates a split first vector output to first active combiner 520 and second active combiner 521. Likewise, second active splitter 511 receives a second input at Port 4 and communicates a split second signal output to first active combiner 520 and second active combiner 521. As used herein, a vector output is equivalent to a signal output, and they may be used interchangeably.

In an exemplary embodiment, the signal transmitted from first active splitter 510 to first active combiner 520 is inverted to produce a 180° phase difference. In another exemplary embodiment, the signal transmitted from second active splitter 511 to second active combiner 521 is also inverted to produce a 180° phase difference. In one embodiment, the appropriate interior differential lines are swapped to produce the 180° phase shift. In an exemplary embodiment and as illustrated in FIG. 5B, active 180° hybrid 500 communicates the signal vectors in differential form between active splitters 510, 511 and active combiners 520, 521. Active splitters 510, 511 and active combiners 520, 521 may implement differential amplifiers to provide the desired functions. Moreover, in an exemplary embodiment, differential signals on a SiGe circuit provide field confinement and improve isolation.

In the exemplary embodiment, first active combiner 520 receives input vectors from first active splitter 510 and second active splitter 511, and outputs a first combined signal to Port 3. The two vectors are summed at the output stage of first active combiner 520, resulting in a composite vector. Similarly, second active combiner 521 receives input vectors from first active splitter 510 and second active splitter 511, and outputs a second combined signal to Port 2. As with first active combiner 520, the two vectors are summed at the output stage of second active combiner 521, resulting in a composite vector.

Overall, active 180° hybrid 500 receives an input vector on one of two input ports and outputs two vectors that have a 180° phase difference between each other. For example a signal at Port 1 results in two equal amplitude signals appearing at Port 2 and Port 3 but with 180° difference in phase. Similarly a signal appearing at Port 4 results in two equal amplitude signals appearing at Port 2 and Port 3 but with 180° difference in phase.

In an exemplary embodiment an active 180° hybrid comprises two active splitters and two active combiners, wherein the active 180° hybrid is configured to provide a 180° phase difference between two output signals. In accordance with another exemplary embodiment, an active 180° hybrid comprises a first input port in communication with a first active splitter, where the first active splitter is configured to split a first input signal, a second input port in communication with a second active splitter, where the second active splitter is configured to split a second input signal, a first active combiner configured to receive the second input signal from the second active splitter and the first input signal from the first active splitter, where the first input signal is inverted, and wherein the first active combiner outputs a first composite vector; and a second active combiner configured to combine the first input signal from the first active splitter and the second input signal from the second active splitter, where the second input signal is inverted, and wherein the second active combiner outputs a second composite vector. Furthermore, in the exemplary embodiment, there is a 180° phase difference between the first composite vector and the second composite vector.

In another exemplary embodiment, a method comprises splitting, at a first active splitter, a first input signal received from a first input port, splitting, at a second active splitter, a second input signal received from a second input port, combining, at a first active combiner, the second input signal received from the second active splitter and an inverted first input signal received from the first active splitter, wherein the first active combiner outputs a first composite vector; and combining, at a second active combiner, the first input signal received from the first active splitter and an inverted second input signal received from the second active splitter, where the second active combiner outputs a second composite vector. Furthermore, in the exemplary embodiment, there is a 180° phase difference between the first composite vector and the second composite vector.

Furthermore, in yet another exemplary embodiment, a method comprises providing a signal to at least one of two input ports of an active 180° hybrid, actively splitting the signal into a first split signal and a second split signal, adjusting the phase of the first split signal, and adjusting the phase of the second split signal and inverting the second split signal to respectively create output signals at two output ports of the active 180° hybrid. In the exemplary embodiment, the output signals are 180° out of phase from each other.

Active Quadrature Hybrid

In accordance with another exemplary embodiment, another type of hybrid is disclosed: the active quadrature hybrid. FIG. 6A illustrates a prior art branchline hybrid having four ports and configured for bi-directional communications. In this prior art example, each of the output ports provides a phase shifted replica of the associated input signal that is attenuated in amplitude due to the power split plus ohmic RF losses. In accordance with an exemplary embodiment, an active quadrature hybrid also has four ports but in contrast is not amplitude limited and communicates in a single direction.

Figure 6B:
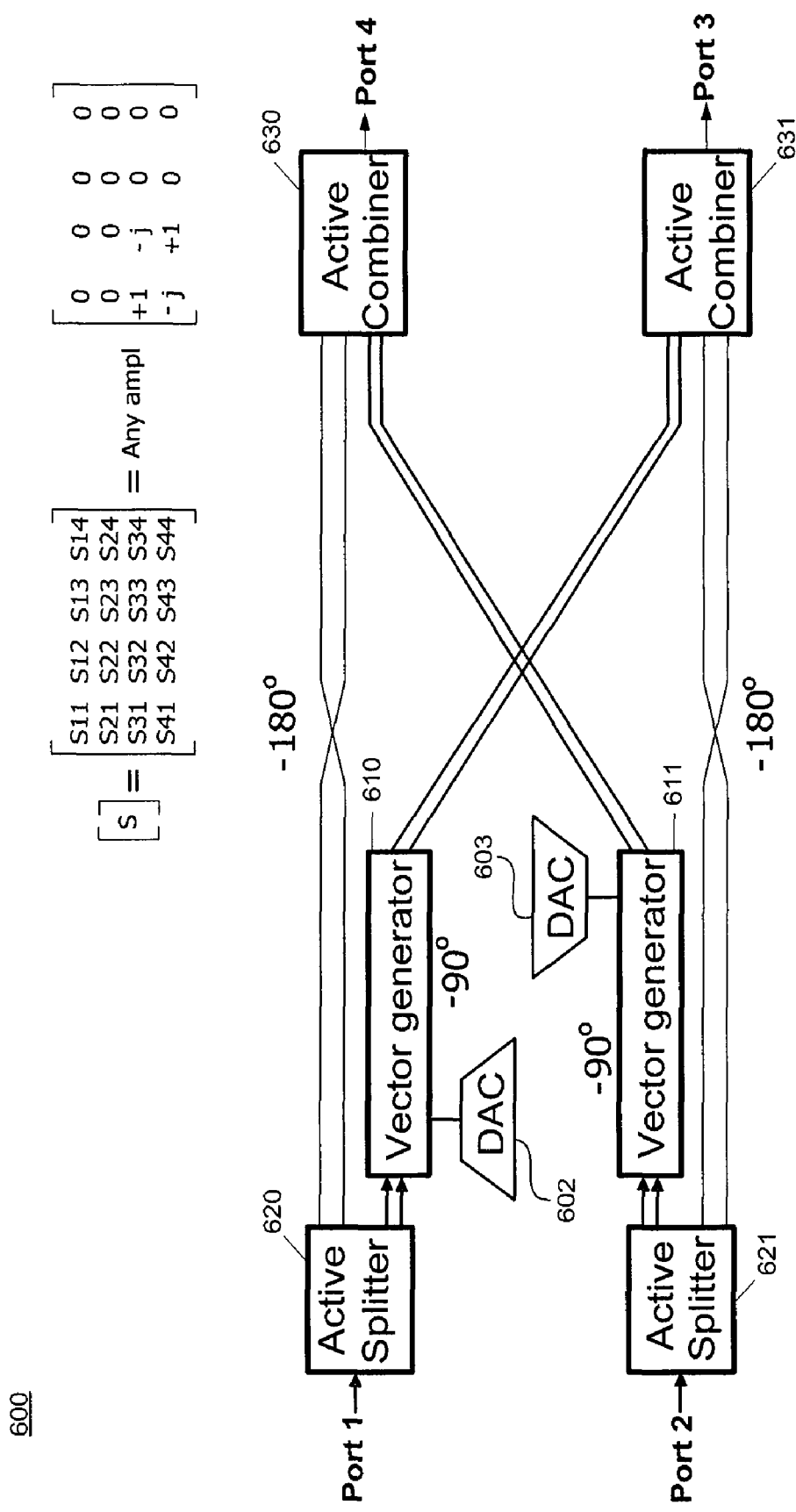
FIG. 6B illustrates an exemplary embodiment of an active quadrature hybrid.

Furthermore, in an exemplary embodiment and with momentary reference to FIG. 6B, an active quadrature hybrid 600 has various advantages over a traditional passive distributed hybrid. In an exemplary embodiment, active quadrature hybrid 600 does not result in a loss of power but instead has a gain or is at least gain neutral. In one embodiment, the active quadrature hybrid does not have ohmic RF losses or power split losses. In another exemplary embodiment, active quadrature hybrid 600 does not rely on distributed elements and is capable of operating over very wide bandwidths. In one exemplary embodiment, active quadrature hybrid 600 is manufactured as an RFIC and is compact.

In accordance with an exemplary embodiment, active quadrature hybrid 600 provides similar functionality in comparison to a prior art distributed branchline hybrid (see FIG. 6A). For example, for an input signal at either input Port 1 or input Port 2, active quadrature hybrid 600 is dynamically configured to provide about a 90° phase difference between the resultant signals transmitted at output Port 3 and output Port 4. Another example is that active quadrature hybrid 600 provides port-to-port isolation and matched impedances at the input/output ports.

In accordance with an exemplary embodiment and with reference to FIG. 6B, an active quadrature hybrid 600 comprises a first vector generator 610, a first active splitter 620, a first active combiner 630, a second vector generator 611, a second active splitter 621, and a second active combiner 631. Active splitters 620, 621 may be of similar description as active splitter 100. Active combiners 630, 631 may be of similar description as active combiner 200. In addition, vector generators 610, 611 may be of similar description as vector generator 300. Furthermore, active quadrature hybrid 600 comprises DACs 602, 603 to control first vector generator 610 and second vector generator 611, respectively. In an exemplary embodiment, a 4-bit DAC is used but any number of bits many be used. In accordance with the exemplary embodiment, first active splitter 620 receives a first input at Port 1 and communicates a split vector output to first vector generator 610 and first active combiner 630. Likewise, second active splitter 621 receives a second input at Port 2 and communicates a split vector output to second vector generator 611 and second active combiner 631.

Furthermore, the output of first vector generator 610 is communicated to second active combiner 631. Similarly, the output of second vector generator 611 is communicated to first active combiner 630. In an exemplary embodiment, vector generators 610, 611 parallel process two vectors that are modulated in amplitude and phase. In one specific embodiment, vector generators 610, 611 provide a −90° phase shift.

In an exemplary embodiment, the signal transmitted from active splitter 620 to active combiner 630 is inverted to produce a 180° phase difference. In another exemplary embodiment, the signal transmitted from active splitter 621 to active combiner 631 is also inverted to produce a 180° phase difference. In one embodiment, the appropriate interior differential lines are swapped to produce the 180° phase shift. In an exemplary embodiment and as illustrated in FIG. 6B, active quadrature hybrid 600 communicates the signal vectors in differential form between active splitters 620, 621 and active combiners 630, 631. Active splitters 620, 621 and active combiners 630, 631 may implement differential amplifiers to provide the desired functions. Moreover, in an exemplary embodiment, differential signals on a SiGe circuit provide field confinement and improve isolation.

In the exemplary embodiment, first active combiner 630 receives input vectors from first active splitter 620 and second vector generator 611, and outputs a signal to Port 4. The two vectors are summed at the output stage of first active combiner 630, resulting in a composite vector. Similarly, second active combiner 631 receives input vectors from the second active splitter 621 and first vector generator 610, and outputs a signal to Port 3. As with first active combiner 630, the two vectors are summed at the output stage of second active combiner 631, resulting in a composite vector.

Overall, active quadrature hybrid 600 receives an input vector, on one of two input ports, and outputs two vectors that have a 90° phase difference between each other. For example a signal at Port 1 results in two substantially equal amplitude signals appearing at Port 3 and Port 4 but with approximately 90° difference in phase. Similarly a signal appearing at Port 2 results in two substantially equal amplitude signals appearing at Port 3 and Port 4 but with approximately 90° difference in phase.

In accordance with an exemplary embodiment, an active quadrature hybrid comprises two active splitters, two active combiners, and two vector generators, where the active quadrature hybrid is configured to provide a 90° phase difference between two output signals. In another exemplary embodiment, a quadrature hybrid comprises a first input port in communication with a first active splitter, where the first active splitter is configured to split a first input signal, a second input port in communication with a second active splitter, where the second active splitter is configured to split a second input signal, a first vector generator configured to receive the first input signal from the first active splitter, where the first vector generator adjusts at least one of the phase or amplitude of the first input signal, a second vector generator configured to receive the second input signal from the second active splitter, where the second vector generator adjusts at least one of the phase or amplitude of the second input signal, a first active combiner configured to receive the second input signal from the second vector generator and the first input signal from the first active splitter, where the first input signal is inverted, and where the first active combiner outputs a first composite vector, a second active combiner configured to combine the first input signal from the first vector generator and the second input signal from the second active splitter, where the second input signal is inverted, and where the second active combiner outputs a second composite vector. Furthermore, in the exemplary embodiment, there is a 90° phase difference between the first composite vector and the second composite vector.

In an exemplary embodiment, a method comprises splitting, at a first active splitter, a first input signal received from a first input port, splitting, at a second active splitter, a second input signal received from a second input port, adjusting, at a first vector generator, at least one of the phase or amplitude of the first input signal received from the first active splitter, adjusting, at a second vector generator, at least one of the phase or amplitude of the second input signal received from the second active splitter, combining, at a first active combiner, the second input signal received from the second vector generator and an inverted first input signal received from the first active splitter, where the first active combiner outputs a first composite vector, and combining, at a second active combiner, the first input signal received from the first vector generator and an inverted second input signal received from the second active splitter, where the second active combiner outputs a second composite vector. Furthermore, in the exemplary embodiment there is a 90° phase difference between the first composite vector and the second composite vector.

The following applications are related to this subject matter: U.S. application Ser. No. 12/759,123, entitled "ACTIVE BUTLER AND BLASS MATRICES," U.S. application Ser. No. 12/759,064, entitled "ACTIVE FEED FORWARD AMPLIFIER," U.S. application Ser. No. 12/759,130, entitled "ACTIVE PHASED ARRAY ARCHITECTURE," U.S. application Ser. No. 12/759,059, entitled "MULTI-BEAM ACTIVE PHASED ARRAY ARCHITECTURE," U.S. application Ser. No. 12/758,996, entitled "PRESELECTOR AMPLIFIER," U.S. application Ser. No. 12/759,148, entitled "ACTIVE POWER SPLITTER" U.S. application Ser. No. 12/759,112, entitled "HALF-DUPLEX PHASED ARRAY ANTENNA SYSTEM," U.S. application Ser. No. 12/759,113, entitled "DIGITAL AMPLITUDE CONTROL OF ACTIVE VECTOR GENERATOR," the contents of which are hereby incorporated by reference for any purpose in their entirety.

In general, the disclosure is provided by way of example and is not a limitation. The specific ranges and numbers disclosed in the papers are for illustration only, and do not limit the invention to those specific examples, ranges, or frequency bands. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

The invention claimed is:

1. A differential phase generating hybrid comprising:
    a first input port in communication with a first active splitter;
    a second input port in communication with a second active splitter;
    a first active combiner configured to receive a first signal from the first active splitter and a second signal from the second active splitter;
    a second active combiner configured to receive the first signal from the first active splitter and the second signal from the second active splitter, wherein the second signal from the second active splitter is inverted;
    a first output port to provide a first composite signal from the first active combiner; and
    a second output port to provide a second composite signal from the second active combiner;
    wherein the size of the differential phase generating hybrid is independent of an operating frequency.

2. The differential phase generating hybrid of claim 1, further comprising:
    a first vector generator configured to inject a phase shift into signals communicated from the first input port to the first active splitter; and
    a second vector generator configured to inject a phase shift into signals communicated from the second input port to the second active splitter.

3. The differential phase generating hybrid of claim 1, wherein the first composite signal is phase shifted approximately 0° from the second composite signal in response to an input signal provided to the first input port.

4. The differential phase generating hybrid of claim 1, wherein the first composite signal is phase shifted approximately 180° from the second composite signal in response to an input signal provided to the second input port.

5. The differential phase generating hybrid of claim 2, wherein the first vector generator and the second vector generator are individually configured to adjust at least one of the phase or amplitude of a signal.

6. The differential phase generating hybrid of claim 5, further comprising:
    a first DAC configured to digitally control the first vector generator; and
    a second DAC configured to digitally control the second vector generator.

7. The differential phase generating hybrid of claim 1, wherein the differential phase generating hybrid is enabled to operate over multiple frequency bands.

8. The differential phase generating hybrid of claim 2, wherein the first vector generator and the second vector generator individually comprise a first quadrant select in parallel with a second quadrant select and a first variable gain amplifier in parallel with a second variable gain amplifier.

9. The differential phase generating hybrid of claim 1, wherein the differential phase generating hybrid is an integrated monolithic solution.

10. The differential phase generating hybrid of claim 1, wherein a signal communicated through the differential phase generating hybrid does not incur a signal power loss.

11. A method comprising:
    receiving a first input signal at a first vector generator from a first input port, wherein the first vector generator adjusts at least one of the phase and amplitude of the first input signal to generate an adjusted first input signal;
    communicating the adjusted first input signal to a first active splitter from the first vector generator;
    receiving a second input signal at a second vector generator from a second input port, wherein the second vector generator adjusts at least one of the phase and amplitude of the second input signal to generate an adjusted second input signal;
    communicating the adjusted second input signal to a second active splitter from the second vector generator;
    splitting, at the first active splitter, the adjusted first input signal and transmitting a split of the adjusted first input signal to a first active combiner and a second active combiner;
    splitting, at the second active splitter, the adjusted second input signal and transmitting a split of the adjusted second input signal to the first active combiner and transmitting an inverted split of the adjusted second input signal to the second active combiner;
    combining, at the first active combiner, a signal provided by the first active splitter and a signal provided by the second active splitter, wherein the first active combiner communicates a first output composite vector; and
    combining, at the second active combiner, the signal provided by the first active splitter and an inverted signal from the second active splitter, wherein the second active combiner communicates a second output composite vector.

12. The method of claim 11, further comprising producing approximately a 0° phase shift difference between the first output composite vector and the second output composite vector in response to an input signal provided to the first input port.

13. The method of claim 11, further comprising producing approximately a 180° phase shift difference between the first output composite vector and the second output composite vector in response to an input signal provided to the second input port.

14. The method of claim 11, wherein the first vector generator adjusts the phase of the first input signal by approximately −90° and wherein the second vector generator adjusts the phase of the second input signal by approximately −90°.

15. The method of claim 11, wherein the split of the adjusted first input signal is transmitted from the first active splitter in differential form and wherein the split of the adjusted second input signal is transmitted from the second active splitter in differential form.

16. The method of claim 11, wherein the first vector generator and the second vector generator individually comprise a first quadrant select in parallel with a second quadrant select and a first variable gain amplifier in parallel with a second variable gain amplifier.

* * * * *